United States Patent
Tsukatani et al.

(10) Patent No.: US 7,674,427 B2
(45) Date of Patent: Mar. 9, 2010

(54) RARE EARTH METAL MEMBER AND MAKING METHOD

(75) Inventors: Toshihiko Tsukatani, Echizen (JP); Hajime Nakano, Echizen (JP); Takao Maeda, Echizen (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 614 days.

(21) Appl. No.: 11/476,066

(22) Filed: Jun. 28, 2006

(65) Prior Publication Data

US 2007/0003790 A1    Jan. 4, 2007

(30) Foreign Application Priority Data

Jun. 29, 2005 (JP) ............................. 2005-189811
Jun. 29, 2005 (JP) ............................. 2005-189830

(51) Int. Cl.
*C22C 28/00* (2006.01)
*C23G 1/02* (2006.01)
*E01B 9/10* (2006.01)
*F16B 33/00* (2006.01)

(52) U.S. Cl. .................. 420/416; 134/41; 411/378; 438/968

(58) Field of Classification Search ................ 420/416; 134/41; 411/378; 438/968
See application file for complete search history.

(56) References Cited

U.S. PATENT DOCUMENTS

| 3,789,014 A | 1/1974 | Graff et al. |
| 4,177,059 A | 12/1979 | Day |
| 6,447,937 B1 | 9/2002 | Murakawa et al. |

FOREIGN PATENT DOCUMENTS

| JP | 4176887 A | 6/1992 |
| JP | 06100957 A | * 4/1994 |
| JP | 10-204508 A | 8/1998 |
| JP | 2001-123206 A | 5/2001 |
| JP | 2002-241971 A | 8/2002 |
| WO | WO-00/34551 A1 | 6/2000 |
| WO | WO-01/94660 A2 | 12/2001 |

OTHER PUBLICATIONS

English language abstract of JP 05 017134 A (Jan. 26, 1993).

* cited by examiner

*Primary Examiner*—Roy King
*Assistant Examiner*—Caitlin Fogarty
(74) *Attorney, Agent, or Firm*—Birch, Stewart, Kolasch & Birch, LLP

(57) ABSTRACT

By using a rare earth metal having a minimal content of impurity metal element, machining it into a member and cleaning with an organic acid-base capping agent, there is obtained a rare earth metal member composed entirely of a rare earth metal and containing not more than 100 ppm of impurity metal element in a sub-surface zone, which member is characterized by a high surface purity, a large grain size, minimized grain boundaries, and improved halogen resistance or corrosion resistance.

11 Claims, 3 Drawing Sheets

RARE EARTH METAL MEMBER AND MAKING METHOD

CROSS-REFERENCE TO RELATED APPLICATION

This non-provisional application claims priority under 35 U.S.C. §119(a) on Patent Application Nos. 2005-189811 and 2005-189830 filed in Japan on Jun. 29, 2005 and Jun. 29, 2005, respectively, the entire contents of which are hereby incorporated by reference.

TECHNICAL FIELD

This invention relates to members of high purity rare earth metals, especially rare earth metal members having an extremely high surface purity, and rare earth metal members provided with helical grooves. More particularly, it relates to rare earth metal members composed entirely of rare earth metals which are resistant to corrosion with halogen-base corrosive gases or plasma thereof so that they are suited for use in semiconductor manufacturing equipment and flat panel display manufacturing equipment such as LC, organic EL and inorganic EL manufacturing equipment; and a method for preparing the same.

BACKGROUND ART

Semiconductor manufacturing equipment and flat panel display manufacturing equipment such as LC, organic EL and inorganic EL manufacturing equipment use a halogen-base corrosive gas atmosphere. To prevent workpieces from impurity contamination, components of these equipment are made of high purity materials, and their surface purity is crucial.

The semiconductor manufacturing process uses gate etching, dielectric etching, resist ashing, sputtering, CVD and other equipment. The liquid crystal manufacturing process uses etching and other equipment for forming thin-film transistors. These manufacturing equipment are equipped with plasma generating mechanisms allowing for microfabrication with the goal of higher integration and the like.

In these manufacturing processes, many equipment utilize halogen-base corrosive gases such as fluorine and chlorine gases as the treating gas because of their reactivity. Fluorine-base gases include $SF_6$, $CF_4$, $CHF_3$, $ClF_3$, $HF$, $NF_3$ and the like, and chlorine-base gases include $Cl_2$, $BCl_3$, $HCl$, $CCl_4$, $SiCl_4$ and the like. When radio frequency or microwaves are applied to an atmosphere filled with such gases, the gases are activated into plasmas. Since members in the equipment are exposed to the halogen-base corrosive gases or plasmas thereof, they are required to contain a minimal amount of metal other than the principal constituent material and to have high corrosion resistance.

Prior art materials capable of imparting corrosion resistance against halogen-base gases or plasmas thereof to meet these requirements include ceramics such as quartz, alumina, silicon nitride and aluminum nitride, anodized aluminum, and spray coated substrates in which the foregoing materials are sprayed to the substrate surface to form a spray coating. JP-A 2002-241971 discloses a plasma-resistant member in which a surface region to be exposed to plasma in corrosive gas is formed of a metal layer of Group IIIA in the Periodic Table having a thickness of about 50 to 200 μm.

Regrettably, the ceramic members require an increased machining cost and suffer from the problem of particles left on the surface. When the ceramic members are exposed to plasma in a corrosive gas atmosphere, corrosion gradually takes place, though to a varying extent, whereupon crystal grains spall off from the surface region, causing so-called particle contamination. Once spalling off, particles are likely to deposit on or near the semiconductor wafer, lower electrode or the like to exert negative impact on etching precision or the like, detracting from the semiconductor performance and reliability.

The ceramic members are characterized by the elimination of electric conduction and cannot be used as radio-frequency grounding members requiring electric conductivity. At the site where such characteristics are required, anodized aluminum parts are often used, but suffer from problems like a short life and release of AlF particles. At such a site, members having sprayed thereon yttrium oxide ($Y_2O_3$) having better halogen plasma resistance have been recently used.

However, the advanced plasma environment has a propensity for increasing energy, raising a problem that spark partially generates due to a tipping of the plasma balance. It is believed that the spark generation is attributed to the dielectric material which is sprayed on the surface of conductive material, and specifically, microscopic surface irregularities on the sprayed coating and open pores therein extending to the substrate. Efforts have been made to reduce the size of surface irregularities and pores, but these countermeasures are unsatisfactory.

One probable means for solving the problem is to set in a plasma environment an electrically conductive part which allows a direct current component to escape to the ground so as to avoid spark generation. There have been found no members that enable this idea.

As discussed above, JP-A 2002-241971 discloses a plasma-resistant member in which a surface region to be exposed to plasma in corrosive gas is formed of a metal layer of Group IIIA in the Periodic Table. The thickness of the metal layer is about 50 to 200 μm, but its electric resistance is described nowhere. In the semiconductor manufacturing equipment, the reaction product of the process gas with a workpiece will deposit on members in the equipment chamber, and periodic cleaning is thus needed for removal of the reaction product deposits. In the event that the corrosion resistant member is a layer of about 200 μm thick, however, this corrosion resistant layer can be readily abraded away to expose the underlying substrate during the operation of polishing and cleaning for removal of the reaction product deposits. Thus this member cannot maintain the desired corrosion resistance on repeated use.

In the current semiconductor device art, there is an increasing propensity for feature size reduction and overall diameter increase. Concomitantly, the so-called dry process, especially etching process uses low-pressure high-density plasma. As compared with conventional etching conditions, the low-pressure high-density plasma has great influence on the plasma-resistant member, making more serious the problems including erosion by plasma, contamination of member components caused by the erosion, and contamination with the reaction products of surface impurities.

In general, unwanted metal elements or impurities that cause defectives in the semiconductor manufacturing process include Na, K, Ca, Mg, Fe, Cr, Cu, Ni, Zn, Al and the like. Among others, Fe, Cu, Ni, Zn and Cr are unwanted. Accordingly, not only equipment components, but also members for securing the components have to be plasma resistant.

While metal machining tools are used for cutting, grinding and otherwise machining of members, the machined members are contaminated on their surface. When used in a halogenic plasma atmosphere, such contaminated members become the causes of particle contamination and erosion.

DISCLOSURE OF THE INVENTION

An object of the present invention is to provide a rare earth metal member which is composed entirely of a rare earth metal, is free of surface contamination, and has improved corrosion resistance or plasma resistance in that it fully withstands exposure to halogen-base gases or plasmas thereof and undergoes no drop of corrosion resistance by periodic cleaning; and a method for preparing the same.

Another object of the present invention is to provide a rare earth metal member which has improved corrosion resistance or plasma resistance in halogen-base corrosive gases or plasma thereof, minimized particle generation, and high electric conductivity so that it is suited for use in semiconductor manufacturing equipment or flat panel display manufacturing equipment.

The inventors have discovered that a rare earth metal member consisting essentially of a rare earth metal and containing not more than 100 ppm of at least one metal element other than the rare earth metal in a zone extending from the outermost surface to a depth of 2 μm has a denseness and corrosion resistance in itself enough to eliminate a need for a corrosion resistant layer on the surface, has halogen-base gas resistance and halogenic plasma resistance, and is thus useful in semiconductor manufacturing equipment and flat panel display manufacturing equipment. Since this member exhibits corrosion resistance in itself, it is free from a decline of corrosion resistant performance by flaws during repeated cleaning. When a rare earth metal member is prepared by furnishing an ingot consisting essentially of a rare earth metal and containing not more than 100 ppm of at least one metal element other than the rare earth metal, machining the ingot into a member and cleaning the member with a solution of an organic acid-base capping agent such as citric acid or tartaric acid to remove any contaminants from the surface of the machined member, it becomes possible to prevent contamination of the member with the reaction products with halogen-base gases. The resulting rare earth metal member has a surface purity equivalent to the bulk and exhibits an electric conductivity as demonstrated by a surface resistivity of $1 \times 10^{-5}$ to $1 \times 10^{2}$ ohm/square ($\Omega$/□) because it is composed entirely of the rare earth metal. The member is thus useful in semiconductor manufacturing equipment and flat panel display manufacturing equipment.

The inventors have also discovered that a rare earth metal member having helical grooves according to the ISO Standard, Unified Standard or Inch Standard obtained by machining a rare earth metal ingot has a denseness and corrosion resistance in itself enough to eliminate a need for a corrosion resistant layer on the surface, has halogenic plasma resistance, and is thus useful as securing parts for components in semiconductor manufacturing equipment. Even when the components are required to be electrically conductive, the securing parts which are made of highly conductive rare earth metals do not interfere with the required performance. As opposed to conventional plasma-resistant members having the problems that the metal coating layer can be separated away by a tool during manipulation and the members cannot be configured to a complex shape, the rare earth metal member of the invention avoids these problems because it is composed entirely of rare earth metal. The present invention is predicated on these findings.

In one aspect, the present invention provides a rare earth metal member and a method as defined below.

[1] A rare earth metal member consisting essentially of a rare earth metal and having an outermost surface, said member containing not more than 100 ppm of at least one metal element other than the rare earth metal in a zone extending from the outermost surface to a depth of 2 μm.

[2] The rare earth metal member of [1] wherein the rare earth metal is at least one element selected from the group consisting of Y, Sc, Gd, Tb, Dy, Ho, Er, Tm, Yb, and Lu.

[3] The rare earth metal member of [1] or [2] wherein the metal element other than the rare earth metal is selected from the group consisting of Na, K, Ca, Mg, Fe, Cr, Cu, Ni, Zn and Al.

[4] The rare earth metal member of [1], [2] or [3] wherein said member contains not more than 100 ppm of the at least one metal element other than the rare earth metal in a zone extending from the outermost surface to a depth of 300 μm.

[5] A rare earth metal member consisting essentially of a rare earth metal and containing not more than 100 ppm of at least one metal element other than the rare earth metal.

[6] The rare earth metal member of any one of [1] to [5] which is obtained by machining an ingot consisting essentially of a rare earth metal and containing not more than 100 ppm of at least one metal element other than the rare earth metal.

[7] The rare earth metal member of any one of [1] to [6] which is a polycrystalline form of rare earth metal which is composed of grains having a grain size of at least 3 mm.

[8] The rare earth metal member of any one of [1] to [7] for use in semiconductor manufacturing equipment or flat panel display manufacturing equipment.

[9] The rare earth metal member of [8] which is used in a halogen-base gas or halogen-base plasma atmosphere.

[10] A method of preparing the rare earth metal member of any one of [1] to [9], comprising the steps of machining an ingot consisting essentially of a rare earth metal and containing not more than 100 ppm of at least one metal element other than the rare earth metal, and cleaning with an organic acid-base capping agent solution.

[11] The method of [10] wherein the organic acid-base capping agent is selected from the group consisting of citric acid, monoammonium citrate, gluconic acid, glycolic acid, nitric triacetate salt, ethylenediaminetetraacetic acid, diethylenetriaminopentaacetic acid, dihydroxyethylene glycine, triethanolamine, hydroxyethylenediaminetetraacetic acid, L-ascorbic acid, malic acid, tartaric acid, oxalic acid, gallic acid, glyceric acid, hydroxybutyric acid, glyoxylic acid, and salts thereof.

By using a rare earth metal containing not more than 100 ppm of at least one metal element other than the rare earth metal, machining it into a member and cleaning with an organic acid-base capping agent, there is obtained a rare earth metal member having a high surface purity, a large grain size, minimized grain boundaries, and improved halogen resistance or corrosion resistance.

In another aspect, the present invention provides a rare earth metal member as defined below.

[12] A rare earth metal member having helical grooves as prescribed in the ISO Standard, Unified Standard or Inch Standard.

[13] The rare earth metal member of [12] wherein the rare earth metal is at least one element selected from the group consisting of Y, Sc, Gd, Tb, Dy, Ho, Er, Tm, Yb, and Lu.

[14] The rare earth metal member of [12] or [13] which is a screw, bolt or nut.

The rare earth metal member having helical grooves is improved in corrosion resistance against halogen-base corrosive gases or plasmas thereof. When used in semiconductor manufacturing equipment or flat panel display manufacturing equipment, the rare earth metal member is thus effective for inhibiting particle contamination by plasma etching, ensuring efficient production of products of quality.

DESCRIPTION OF THE PREFERRED EMBODIMENTS

Figure 1:
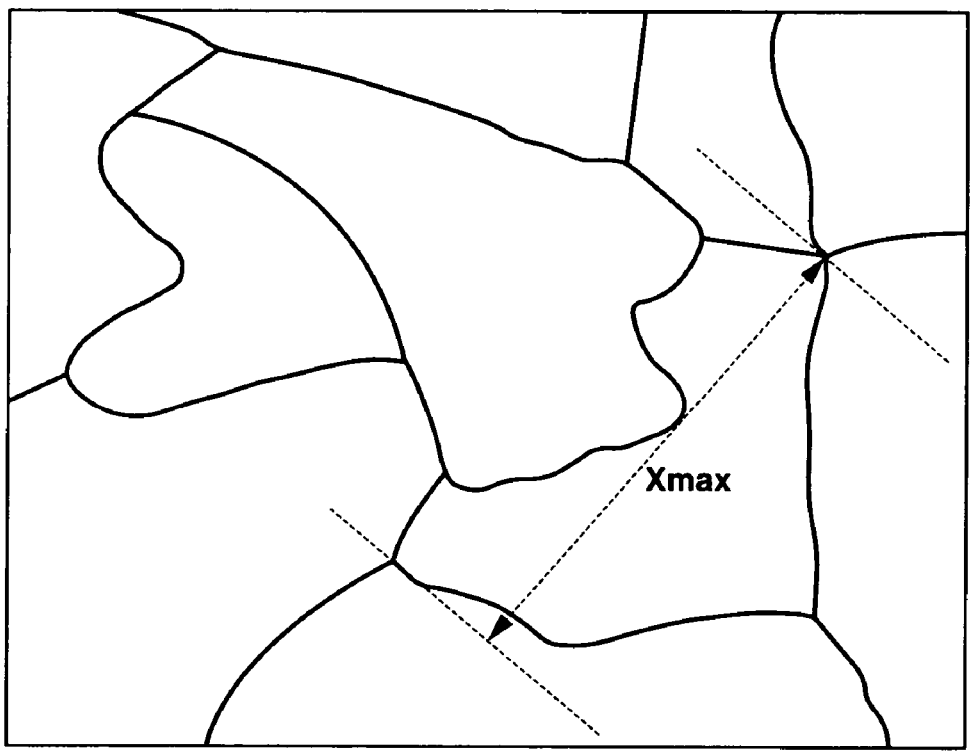
FIG. 1 illustrates how to measure a grain size.

As used herein, the phrase "containing not more than 100 ppm of at least one metal element" means that if the member contains one metal element, the member contains not more than 100 ppm of that metal element, and if the member contains more than one metal element, the member contains not more than 100 ppm of each of the metal elements. The term "ppm" is parts by weight per million parts by weight.

As defined above, the rare earth metal member of the invention consists essentially of a rare earth metal and has an outermost surface, the member containing not more than 100 ppm of at least one metal element other than the rare earth metal in a zone extending from the outermost surface to a depth of 2 μm.

The rare earth metal used in the member of the invention is preferably an element selected from the group consisting of Y, Sc, La, Ce, Pr, Nd, Sm, Eu, Gd, Tb, Dy, Ho, Er, Tm, Yb, and Lu, and more preferably from the group consisting of Y, Sc, Gd, Tb, Dy, Ho, Er, Tm, Yb, and Lu. These rare earth metal elements may be used alone or in combination of two or more.

Metal elements which will invite defects to semiconductor products in the semiconductor manufacturing process or the like include Na, K, Ca, Mg, Fe, Cr, Cu, Ni, Zn and Al, among which Fe, Cu, Ni, Zn and Cr are especially unwanted. The contents of such metal elements other than the rare earth metal should be each equal to or less than 100 ppm, preferably equal to or less than 60 ppm, in a zone extending from the outermost surface to a depth of 2 μm or less. More preferably, the contents of Na, K, Ca, Mg, Cr and Zn are each equal to or less than 10 ppm. If the content of metal element other than the rare earth metal exceeds 100 ppm, the semiconductor product suffers metal contamination in excess of the permissible level.

In a preferred embodiment of the inventive member, the content of metal element other than the rare earth metal is within the above-specified range in a zone of the member extending from the outermost surface to a depth of 300 μm, especially throughout the member. If the member interior has an excessive content of unwanted metal element despite the minimized content of unwanted metal element at the surface, there is a possibility that the unwanted metal element diffuse outward, causing contamination. For this reason, it is preferred that the content of unwanted metal element be minimized in the member interior as well.

Because of the use of rare earth metal, the member of the invention is fully electrically conductive. Preferably it has a surface resistivity of $1 \times 10^{-5}$ to $1 \times 10^{2}$ ohm/square ($\Omega/\square$). more preferably $1 \times 10^{-5}$ to $1 \times 10^{1}$ $\Omega/\square$. Too high a surface conductivity may lead to insufficient grounding and other fault, failing to serve the electric conductive member function.

Described below is the method of preparing a rare earth metal member according to the present invention.

The method starts with the step of furnishing an ingot by melting a rare earth metal material containing not more than 100 ppm of each metal element other than the rare earth metal, and processing the melt into an ingot by any standard technique. The technique of melting the rare earth metal material includes electron beam melting, arc melting, induction melting or the like. The rare earth metal ingot resulting from melting should preferably contain 0.03 to 2.0% by weight of oxygen. If the oxygen content is less than 0.03% by weight, the ingot may have so low hardness that the member obtained therefrom is difficult to machine. An oxygen content of more than 2.0% by weight may reduce the electric conduction of rare earth metal.

Next, the ingot is machined into a desired shape. Suitable machining techniques include lathing, milling, wire cut electro-discharge machining (EDM), laser cutting, fine blanking, dicing, planing, and water jet machining.

After machining, the member carries contaminants on its surface, which contaminants result from the machining tool and must be removed subsequently. For example, the milling tool leaves Fe, Ni, and Cr contaminants, and the wire cut EDM leaves Cu and Zn contaminants.

Ordinary techniques for removal of surface contaminants include polishing, ultrasonic cleaning, mineral acid pickling, and alkaline cleaning. The polishing fails to remove contaminants thoroughly and rather causes the surface contaminants to diffuse. The ultrasonic cleaning can remove contaminants deposited on the surface, but not contaminants anchored to the surface or forming a solid solution with the base material. The mineral acid pickling can form an oxide film on the rare earth metal surface. Unwanted metal elements are incorporated in the oxide film, so that complete removal thereof is not achievable. In the case of alkaline cleaning, for example, a mixed aqueous solution of ammonia and hydrogen peroxide can remove Cu and Zn contaminants which have not formed a solid solution with the base material, but not Fe and other contaminants. The inventors have found that cleaning with an organic acid-base capping agent is an effective technique for removal of surface contaminants.

Suitable organic acid-base capping agents used herein include citric acid, monoammonium citrate, gluconic acid, glycolic acid, nitric triacetate salt, ethylenediaminetetraacetic acid, diethylenetriaminopentaacetic acid, dihydroxyethylene glycine, triethanolamine, hydroxyethylenediaminetetraacetic acid, L-ascorbic acid, malic acid, tartaric acid, oxalic acid, gallic acid, glyceric acid, hydroxybutyric acid, glyoxylic acid, and salts thereof. Inter alia, citric acid and tartaric acid are preferred.

The organic acid-base capping agent is preferably diluted with deionized water to a concentration of 0.001 to 1 mole/L, especially 0.05 to 0.5 mole/L, prior to use. Outside the range, too low a concentration may achieve insufficient cleaning whereas too high a concentration may cause excessive erosion to the member or make it difficult to determine the cleaning time. The member as machined is immersed in the solution for dissolving away the surface contaminants. In this regard, the use of a ultrasonic agitation tank facilitates cleaning. The immersion time is preferably about 30 seconds to about 30 minutes although it depends on the degree of contamination.

After the immersion, the member is washed with deionized water for removing any deposits or contaminants completely. Washing in an ultrasonic agitation tank is preferred because even deposits or contaminants caught in recesses on the member surface can be removed.

It is noted that when an ingot is prepared by melting a rare earth metal material, impurity elements collect at grain boundaries. If a member composed of crystal grains with numerous grain boundaries is used in a halogen gas atmosphere, the grain boundaries are selectively etched with the halogen gas. Then a rare earth metal member having less grain boundaries, i.e., a larger grain size is preferred. By reducing the content of metal element other than the rare earth metal to or below 100 ppm according to the method of the invention, a rare earth metal polycrystalline member having a grain size of at least 3 mm is obtainable. This prevents corrosion from starting from grain boundaries and improves the corrosion resistance of the member. Provided that each crystal grain has three dimensions of length, breadth and thickness, the term "grain size" is defined as an average obtained by measuring the length of thirty (30) crystal grains and averaging the length values. More specifically, referring to FIG. 1, the grain size is determined by drawing two parallel lines tangential to the contour of a grain, measuring the distance X between the two parallel lines, and choosing among the distance values a maximum Xmax which is the length. Before the grain size is determined in this way, the rare earth metal member is washed with water, then dipped in a nital solution (3 vol % nitric acid+97 vol % ethanol) for 5 minutes, and washed with deionized water again for removal of the nital solution, so that grain boundaries are clearly observable.

In the other aspect, the present invention provides a rare earth metal member having helical grooves as prescribed in the ISO Standard, Unified Standard or Inch Standard. The rare earth metal used herein is preferably an element selected from the group consisting of Y, Sc, La, Ce, Pr, Nd, Sm, Eu, Gd, Tb, Dy, Ho, Er, Tm, Yb, and Lu, and more preferably from the group consisting of Y, Sc, Gd, Tb, Dy, Ho, Er, Tm, Yb, and Lu. The rare earth metal elements may be used alone or in admixture of two or more.

Figure 2A:
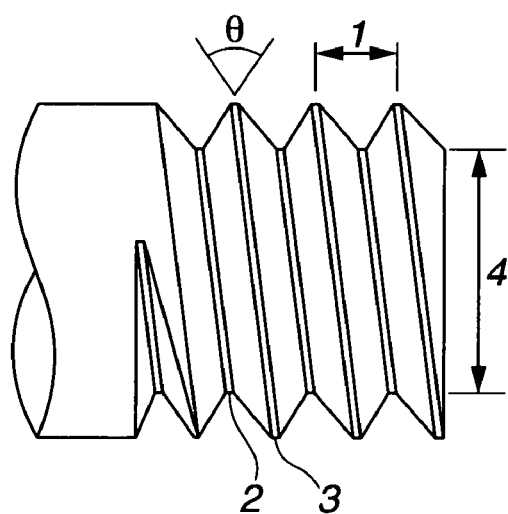
FIG. 2a is a side view of a bolt with external threads.
Figure 2B:
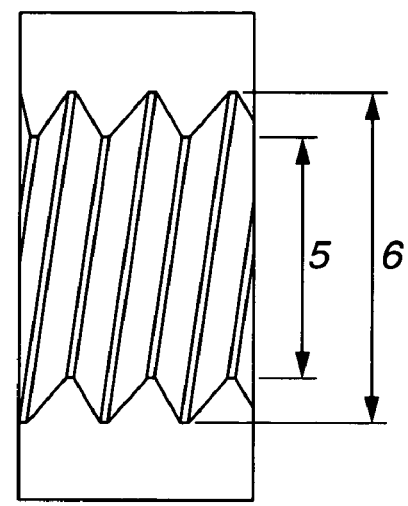
FIG. 2b is a cross-sectional view of a nut with internal threads.

The member is composed of the above rare earth metal element or elements and has helical grooves configured as prescribed in the ISO Standard, Unified Standard or Inch Standard. Typical members are fastening members such as screws, bolts and nuts. The helical thread cutting is not particularly limited as long as the member has helical thread crests and roots arranged at an identical pitch as shown in FIG. 2. FIGS. 2a and 2b illustrate a bolt with external threads and a nut with internal threads, respectively. Threads define an included angle θ and include roots 2 and crests 3 arranged at a pitch 1. The bolt has a diameter 4 between roots of external threads. The nut has an inner diameter 5, and a diameter 6 between roots of internal threads. Examples of the member of the invention include, but are not limited to, hexagon head bolts, oval counter-sunk screws, pan head screws, flat head screws, wing screws, truss head screws, cap screws, hexagon head nuts, flange nuts, knurled nuts, cap nuts, and wing nuts.

The member of the invention can be prepared by melting the rare earth metal, cooling and solidifying the melt into an ingot, and performing helical thread cutting according to the ISO Standard, Unified Standard or Inch Standard using a machining tool.

The technique of melting the rare earth metal material includes radio frequency induction melting, arc melting, electron beam melting or the like. The rare earth metal ingot resulting from melting should preferably contain 0.03 to 2.0% by weight of oxygen. If the oxygen content is less than 0.03% by weight, the ingot may have so low hardness that the member obtained therefrom is difficult to machine. An oxygen content of more than 2.0% by weight may reduce the electric conduction of rare earth metal.

Suitable machines for machining the ingot into a member of a desired shape include lathes, milling machines, machining centers, wire cut EDM equipment, laser cutting machines, fine blanking machines, dicing machines, planers, water jet machines, and band saw mills. By selecting an appropriate machine in accordance with the intended member shape, the ingot may be machined to form helical grooves according to the ISO Standard, Unified Standard or Inch Standard. Exemplary threading patterns include triangular threads, rectangular threads, trapezoidal threads, saw-tooth threads, round threads, and ball threads when classified in terms of shape, and coarse and fine threads when classified in terms of standard.

The rare earth metal member as machined is contaminated with the machining tool, abrasives and the like. For example, the milling tool leaves Fe, Ni, and Cr contaminants, and the wire cut EDM leaves Cu and Zn contaminants on the member. Such contaminants must be removed by polishing or cleaning. For polishing, a lapping machine, polishing machine or the like may be used. For surface cleaning, ultrasonic cleaning and cleaning with chemical liquids such as acids, alkalis and alcohols may be used.

EXAMPLE

Examples are given below by way of illustration and not by way of limitation.

Example 1

Metallic yttrium in particulate form containing not more than 100 ppm of each of metal elements other than rare earth, Na, K, Ca, Mg, Fe, Cr, Cu, Ni, Zn and Al, was melted by electron beam bombardment and solidified into an ingot of 50 mm×50 mm×200 mm. The ingot was analyzed for oxygen by an IR combustion method using EMGA-650 (Horiba Mfg. Co., Ltd.), detecting an oxygen content of 1.0% by weight. The ingot was sliced by wire cut EDM to form a plate of 5 mm×20 mm×20 mm or 5 mm×40 mm×100 mm. The machined surface was brass colored due to brass contamination. The plate was dipped in an aqueous solution of 0.25 mole/L citric acid for 10 minutes, while stirring. After the acid cleaning, the plate was washed with flowing deionized water, dipped in deionized water in a ultrasonic agitation tank for 5 minutes, and washed again with flowing deionized water.

The metallic yttrium plate as surface cleaned was analyzed in depth by glow discharge mass spectroscopy (glow discharge mass spectrometer model VG9000 by Thermo Electron Corp.). The analytic results are shown in Table 1. Using a resistivity meter Loresta HP (Mitsubishi Chemical Corp.), the surface resistivity was measured to be $2.178 \times 10^{-4}$ Ω/square.

Using a reactive ion etching (RIE) equipment, the metallic yttrium plate after surface cleaning was subjected to an exposure test to $CF_4$ plasma for 10 hours where an etching rate was measured. The etching rate was determined by masking an area of the metallic yttrium plate with polyimide tape, and measuring the difference in height between the masked and unmasked areas under a laser microscope VK-8500 (Keyence Corp.). The plasma exposure conditions included a power of 0.55 W/cm$^2$, a gas mixture of $CF_4$ (80%)+$O_2$ (20%), a gas flow rate of 50 sccm, and a pressure of 6.0-7.9 Pa. The analytic results are shown in Table 2. For comparison purposes, the etching rate of quartz was also measured.

Also, the metallic yttrium plate after surface cleaning was immersed in a nital solution for 5 minutes, washed with water, and observed for grains under a metallographical microscope BX60M (Olympus Optical Co., Ltd.), finding a grain size of 5.0 mm.

Example 2

The procedure of Example 1 was repeated aside from using metallic dysprosium in particulate form containing not more than 100 ppm of each of metal elements other than rare earth, Na, K, Ca, Mg, Fe, Cr, Cu, Ni, Zn and Al. A metallic dysprosium plate was formed, surface cleaned with citric acid aqueous solution, and analyzed. The results of glow discharge mass spectroscopy are shown in Table 1. The results of plasma etching test are shown in Table 2. The grain size was 5.7 mm. The surface resistivity was $2.056 \times 10^{-4}$ Ω/square when measured as in Example 1.

Comparative Example 1

A plate was formed as in Example 1 using metallic yttrium in particulate form containing not more than 100 ppm of each of metal elements other than rare earth, Na, K, Ca, Mg, Fe, Cr, Cu, Ni, Zn and Al. The machined surface of the metallic yttrium plate was polished with silicon carbide abrasive paper for removing machining contaminants, washed with flowing deionized water, dipped in deionized water in an ultrasonic agitation tank for 5 minutes, and washed again with flowing deionized water. The metallic yttrium plate as surface cleaned was analyzed in depth by glow discharge mass spectroscopy as in Example 1. The results are shown in Table 1.

TABLE 1

Glow discharge mass spectroscopy data
(contents of metal elements other than rare earth, ppm)

|       | Example 1 | | Example 2 | | Comparative Example 1 | |
|-------|-----------|--------|-----------|--------|-----------|--------|
| Depth | 0.2 μm    | 300 μm | 0.2 μm    | 300 μm | 0.2 μm    | 300 μm |
| Na    | 4         | 5      | 2         | 3      | 17        | 4      |
| K     | 2         | 0.8    | 1         | 2      | 4         | 0.6    |
| Ca    | 9         | 8      | 3         | 3      | 210       | 9      |
| Mg    | 4         | 7      | 7         | 5      | 275       | 5      |
| Fe    | 28        | 40     | 51        | 60     | 217       | 42     |
| Cr    | 0.9       | 0.7    | 2         | 1      | 5         | 0.9    |
| Cu    | 56        | 52     | 25        | 31     | 329       | 51     |
| Ni    | 13        | 14     | 6         | 5      | 839       | 15     |
| Zn    | 7         | 8      | 3         | 5      | 98        | 3      |
| Al    | 26        | 32     | 12        | 10     | 277       | 33     |

TABLE 2

Halide plasma corrosion test data

|                      | Example 1            | Example 2            | quartz               |
|----------------------|----------------------|----------------------|----------------------|
| Etching rate (μm/min)| $5.5 \times 10^{-4}$ | $7.4 \times 10^{-4}$ | $7.7 \times 10^{-2}$ |

Example 3

Metallic yttrium in particulate form was melted by electron beam bombardment and solidified into a rectangular ingot of 150 mm×100 mm×20 mm. The ingot was analyzed for oxygen by an IR combustion method, detecting an oxygen content of 1.1% by weight. The ingot was cut by a band saw into pieces of 150 mm×20 mm×20 mm, which were machined by a lathe/milling machine into hexagon head bolts and hexagon nuts of the ISO standard M6 size. For removing the grinding fluid, the bolts and nuts were immersed in ethanol where ultrasonic cleaning was performed. They were then dipped in an aqueous solution of 0.25 mole/L citric acid where ultrasonic cleaning was performed. They were washed with a large volume of deionized water for removing the citric acid. Bolts and nuts of yttrium were obtained in this way.

Example 4

Metallic gadolinium in particulate form was melted by electron beam bombardment and solidified into a rectangular ingot of 150 mm×100 mm×20 mm. The ingot was analyzed for oxygen by an IR combustion method, detecting an oxygen content of 0.8% by weight. The ingot was cut by a band saw into pieces of 150 mm×20 mm×20 mm, which were machined by a lathe/milling machine into hexagon head bolts and hexagon nuts of the ISO standard M6 size. For removing the grinding fluid, the bolts and nuts were immersed in ethanol where ultrasonic cleaning was performed. They were then dipped in an aqueous solution of 0.25 mole/L citric acid where ultrasonic cleaning was performed. They were washed with a large volume of deionized water for removing the citric acid. Bolts and nuts of gadolinium were obtained in this way.

Example 5

Metallic dysprosium in particulate form was melted by electron beam bombardment and solidified into a rectangular ingot of 150 mm×100 mm×20 mm. The ingot was analyzed for oxygen by an IR combustion method, detecting an oxygen content of 0.9% by weight. The ingot was cut by a band saw into pieces of 150 mm×20 mm×20 mm, which were machined by a lathe/milling machine into hexagon head bolts and hexagon nuts of the ISO standard M6 size. For removing the grinding fluid, the bolts and nuts were immersed in ethanol where ultrasonic cleaning was performed. They were then dipped in an aqueous solution of 0.25 mole/L citric acid where ultrasonic cleaning was performed. They were washed with a large volume of deionized water for removing the citric acid. Bolts and nuts of dysprosium were obtained in this way.

Example 6

A mixture of metallic gadolinium and metallic dysprosium in particulate form in a weight ratio of 80:20 was melted by electron beam bombardment and solidified into a rectangular ingot of 150 mm×100 mm×20 mm. The ingot was analyzed for oxygen by an IR combustion method, detecting an oxygen content of 1.0% by weight. The ingot was cut by a band saw into pieces of 150 mm×20 mm×20 mm, which were machined by a lathe/milling machine into hexagon head bolts and hexagon nuts of the ISO standard M6 size. For removing the grinding fluid, the bolts and nuts were immersed in ethanol where ultrasonic cleaning was performed. They were then dipped in an aqueous solution of 0.25 mole/L citric acid where ultrasonic cleaning was performed. They were washed with a large volume of deionized water for removing the citric acid. Bolts and nuts of gadolinium-dysprosium alloy were obtained in this way.

Comparative Example 2

Round rods of aluminum (6061) having a diameter of 20 mm and a length of 150 mm were machined by a lathe/milling machine into hexagon head bolts and hexagon nuts of the ISO standard M6 size. For removing the grinding fluid, the bolts and nuts were immersed in ethanol where ultrasonic cleaning was performed. They were then dipped in an aqueous solution of 0.25 mole/L citric acid where ultrasonic cleaning was performed. They were washed with a large volume of deionized water for removing the citric acid. Bolts and nuts of aluminum were obtained in this way.

Comparative Example 3

Round rods of stainless steel (SUS316) having a diameter of 20 mm and a length of 150 mm were machined by a lathe/milling machine into hexagon head bolts and hexagon nuts of the ISO standard M6 size. For removing the grinding fluid, the bolts and nuts were immersed in ethanol where ultrasonic cleaning was performed. They were then dipped in an aqueous solution of 0.25 mole/L citric acid where ultrasonic cleaning was performed. They were washed with a large volume of deionized water for removing the citric acid. Bolts and nuts of stainless steel were obtained in this way.

Comparative Example 4

Round rods of stainless steel (SUS316) having a diameter of 20 mm and a length of 150 mm were machined by a lathe/milling machine into hexagon head bolts and hexagon nuts of the ISO standard M6 size. For removing the grinding fluid, the bolts and nuts were immersed in ethanol where ultrasonic cleaning was performed. They were then dipped in an aqueous solution of 0.25 mole/L citric acid where ultrasonic cleaning was performed. They were washed with a large volume of deionized water for removing the citric acid. Bolts and nuts of stainless steel were obtained in this way. Then, the portions of the bolts and nuts other than the threaded portions were blast treated to provide rough surfaces, where yttrium oxide powder was spray coated to a coating thickness of 250 µm. Yttrium oxide-coated bolts and nuts were obtained in this way.

Plasma Corrosion Resistance Test

Figure 3C:
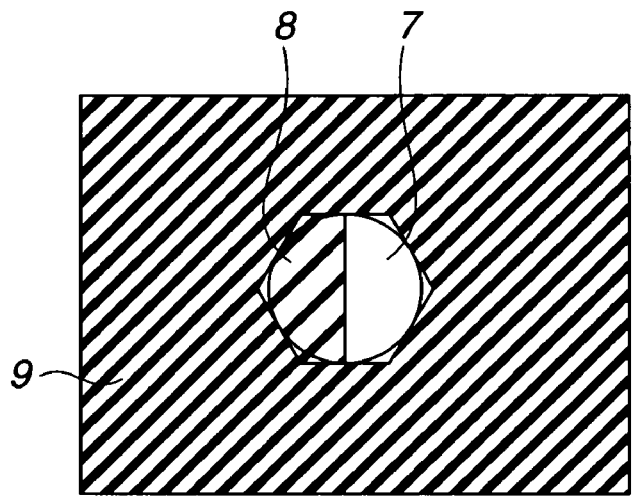
FIGS. 3c and 3d are plan and side views showing a bolt fit in an internally threaded platform, respectively.
Figure 3D:
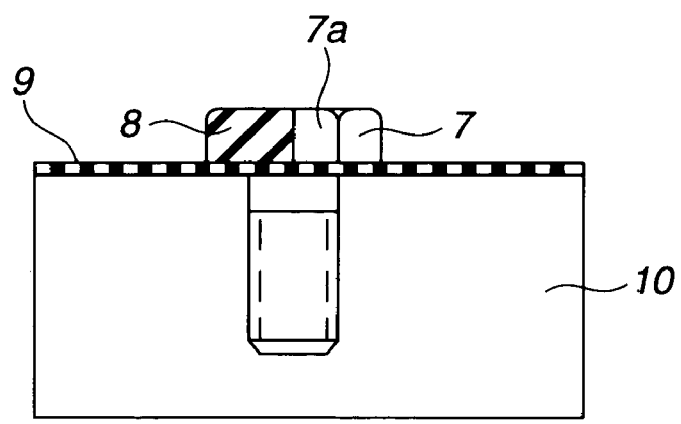

As shown in FIG. 3, the upper surface of the head 7a of an M6 bolt 7 obtained in Examples 3-6 and Comparative Examples 2-4 was half masked with a polyimide tape 8. A platform 10 having M6 internal threads was masked entirely with a polyimide tape 9. The bolt 7 was threaded into the platform 10. Using a reactive ion etching (RIE) equipment, the bolt head was subjected to an exposure test to $CF_4$ plasma for 10 hours where an etching rate was measured. The etching rate was determined by measuring the difference in height between the masked and unmasked areas of the bolt head under a laser microscope. The plasma exposure conditions included a power of 0.55 W/cm$^2$, a gas mixture of $CF_4$ (80%)+ $O_2$ (20%), a gas flow rate of 50 sccm, and a pressure of 6.0-7.9 Pa. The results of the plasma corrosion resistance test are shown in Table 3.

TABLE 3

| | Material | Erosion depth (µm) |
|---|---|---|
| Example 3 | metallic yttrium | 0.57 |
| Example 4 | metallic gadolinium | 0.78 |
| Example 5 | metallic dysprosium | 0.91 |
| Example 6 | Gd—Dy alloy | 0.88 |
| Comparative Example 2 | aluminum (6061) | 3.6 |
| Comparative Example 3 | stainless steel (SUS316) | 4.5 |
| Comparative Example 4 | yttrium oxide spray coating | 1.6 |

Evaluation of Machinability and Durability

With respect to machinability, 50 samples of each bolt or nut of Examples 3-6 and Comparative Examples 2-4 were thread-cut whereupon chips were visually observed for wear. Samples yielding chips of more wear were rated poor (×) and samples yielding chips of less wear were rated good (○).

With respect to durability, each bolt of Examples 3-6 and Comparative Examples 2-4 was repeatedly 100 times attached to and detached from the threaded platform shown in FIG. 3. The threads were visually observed whether or not their crests collapsed (or wore out). Samples with crest collapse were rated poor (×) and samples without crest collapse were rated good (○). The results are shown in Table 4. The durability data of Comparative Example 4 was the same as Comparative Example 3, but the spray coating on the bolt head was-scraped off by repeated attachment.

TABLE 4

| | Material | Machinability | Durability |
|---|---|---|---|
| Example 3 | metallic yttrium | ○ | ○ |
| Example 4 | metallic gadolinium | ○ | ○ |
| Example 5 | metallic dysprosium | ○ | ○ |
| Example 6 | Gd—Dy alloy | ○ | ○ |
| Comparative Example 2 | aluminum (6061) | ○ | X |
| Comparative Example 3 | stainless steel (SUS316) | X | ○ |
| Comparative Example 4 | yttrium oxide spray coating | X | ○ |

Japanese Patent Application Nos. 2005-189811 and 2005-189830 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polycrystalline rare earth metal member consisting essentially of a rare earth metal and having an outermost surface, said member containing not more than 100 ppm of at least one metal element selected from the group consisting of Na, K, Ca, Mg, Fe, Cr, Cu, Ni, Zn and Al in a zone extending from the outermost surface to a depth of 2 µm,
   wherein the polycrystalline rare earth metal member comprises grains having a grain size of at least 3 mm.

2. The rare earth metal member of claim 1 wherein the rare earth metal is at least one element selected from the group consisting of Y, Sc, Gd, Tb, Dy, Ho, Er, Tm, Yb, and Lu.

3. The rare earth metal member of claim 1 wherein said member contains not more than 100 ppm of the at least one metal element other than the rare earth metal in a zone extending from the outermost surface to a depth of 300 µm.

4. The rare earth metal member of claim 1 which is obtained by machining an ingot consisting essentially of a rare earth metal and containing not more than 100 ppm of at least one metal element other than the rare earth metal.

5. A semiconductor manufacturing equipment or flat panel display manufacturing equipment comprising the polycrystalline rare earth metal member of claim 1.

6. A halogen-base gas or halogen-base plasma atmosphere comprising the polycrystalline rare earth metal member of claim 1.

7. The rare earth metal member of claim 1 having helical grooves as prescribed in the ISO Standard, Unified Standard or Inch Standard.

8. The rare earth metal member of claim 7 wherein the rare earth metal is at least one element selected from the group consisting of Y, Sc, Gd, Tb, Dy. Ho, Er, Tm, Yb, and Lu.

9. A screw, bolt or nut comprising the rare earth metal member of claim 7.

10. A method of preparing the rare earth metal member of claim 1, comprising the steps of machining an ingot consisting essentially of a rare earth metal and containing not more than 100 ppm of at least one metal element other than the rare earth metal, and cleaning with an organic acid-base capping agent solution.

11. The method of claim 10 wherein the organic acid-base capping agent is selected from the group consisting of citric acid, monoammonium citrate, gluconic acid, glycolic acid, nitric triacetate salt, ethylenediaminetetraacetic acid, diethylenetriaminopentaacetic acid, dihydroxyethylene glycine, tiethanolamine, hydroxyethylenediaminetetraacetic acid, L-ascorbic acid, malic acid, tartaric acid, oxalic acid, gallic acid, glyceric acid, hydroxybutyric acid, glyoxylic acid, and salts thereof.

* * * * *